(12) United States Patent
Coffy et al.

(10) Patent No.: US 10,865,962 B2
(45) Date of Patent: Dec. 15, 2020

(54) PROTECTION MECHANISM FOR LIGHT SOURCE

(71) Applicant: STMICROELECTRONICS (GRENOBLE 2) SAS, Grenoble (FR)

(72) Inventors: Romain Coffy, Voiron (FR); Jean-Michel Riviere, Froges (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 16/432,577

(22) Filed: Jun. 5, 2019

(65) Prior Publication Data
US 2019/0376667 A1    Dec. 12, 2019

(30) Foreign Application Priority Data

Jun. 12, 2018 (FR) .................................. 18 55128
Aug. 31, 2018 (FR) .................................. 18 57833

(51) Int. Cl.
| | |
|---|---|
| F21V 21/00 | (2006.01) |
| F21V 15/01 | (2006.01) |
| F21V 19/00 | (2006.01) |
| H01S 5/022 | (2006.01) |

(52) U.S. Cl.
CPC ............ *F21V 15/01* (2013.01); *F21V 19/003* (2013.01); *H01S 5/02212* (2013.01)

(58) Field of Classification Search
CPC ..... F21V 15/01; F21V 19/003; H01S 5/02212
USPC .............. 362/355, 362, 311.01, 311.02, 259; 372/94, 103
See application file for complete search history.

(56) References Cited

U.S. PATENT DOCUMENTS

| | | | |
|---|---|---|---|
| 6,778,574 B1 | 8/2004 | Shimonaka et al. | |
| 6,816,523 B1 | 11/2004 | Glenn et al. | |
| 7,942,556 B2 * | 5/2011 | Harbers | F21V 17/02 362/294 |
| 8,672,517 B2 * | 3/2014 | Chung | F21K 9/00 362/294 |
| 8,770,774 B2 * | 7/2014 | Ye | F21V 33/0096 362/235 |
| 8,820,950 B2 | 9/2014 | Matsuda et al. | |
| 9,086,209 B2 | 7/2015 | Park et al. | |
| 9,386,202 B2 | 7/2016 | Son | |
| 10,066,808 B2 * | 9/2018 | Fernando | F21V 29/77 |

(Continued)

FOREIGN PATENT DOCUMENTS

| | | |
|---|---|---|
| CN | 101626026 A | 1/2010 |
| CN | 104254798 A | 12/2014 |

(Continued)

OTHER PUBLICATIONS

U.S. Appl. No. 16/439,308, filed Jun. 12, 2019, Housing for Light Source.

(Continued)

*Primary Examiner* — Laura K Tso
(74) *Attorney, Agent, or Firm* — Seed Intellectual Property Law Group LLP

(57) ABSTRACT

The disclosure concerns a housing for a light source mounted on a substrate, the housing comprising: a barrel having first and second conducting columns; and a diffuser having one or more conductive paths arranged to electrically connect the first and second conducting columns when the diffuser is mounted on the barrel.

19 Claims, 8 Drawing Sheets

(56) References Cited

U.S. PATENT DOCUMENTS

| | | | |
|---|---|---|---|
| 10,290,993 B2* | 5/2019 | Chen | H01S 5/183 |
| 2005/0087750 A1 | 4/2005 | Braddell et al. | |
| 2005/0190553 A1 | 9/2005 | Lynch et al. | |
| 2005/0226636 A1 | 10/2005 | Hiramatsu et al. | |
| 2005/0254246 A1* | 11/2005 | Huang | F21V 15/01 |
| | | | 362/362 |
| 2007/0085101 A1 | 4/2007 | Kim | |
| 2008/0087911 A1 | 4/2008 | Stoyan | |
| 2009/0212306 A1 | 8/2009 | Bogner et al. | |
| 2009/0321774 A1 | 12/2009 | Ishi et al. | |
| 2010/0073907 A1* | 3/2010 | Wanninger | G02B 3/04 |
| | | | 362/97.1 |
| 2011/0122303 A1 | 5/2011 | Bonkohara | |
| 2011/0199530 A1 | 8/2011 | Kosaka et al. | |
| 2011/0199766 A1 | 8/2011 | Shibusawa et al. | |
| 2012/0051056 A1* | 3/2012 | Derks | F21V 15/01 |
| | | | 362/257 |
| 2012/0161193 A1 | 6/2012 | Hassan | |
| 2012/0268932 A1 | 10/2012 | Lerman et al. | |
| 2013/0163627 A1 | 6/2013 | Seurin et al. | |
| 2015/0009682 A1* | 1/2015 | Clough | F21V 13/02 |
| | | | 362/311.02 |
| 2015/0117010 A1* | 4/2015 | Auen | G02B 19/0061 |
| | | | 362/257 |
| 2015/0292724 A1 | 10/2015 | Griffoni et al. | |
| 2015/0330616 A1* | 11/2015 | Preuschl | F21V 3/02 |
| | | | 362/362 |
| 2015/0338079 A1* | 11/2015 | Preuschl | F21V 15/01 |
| | | | 362/362 |
| 2015/0369456 A1* | 12/2015 | Creusen | F21V 17/002 |
| | | | 362/257 |
| 2018/0014377 A1 | 1/2018 | Steinkamp et al. | |
| 2018/0093698 A1 | 4/2018 | Urimoto et al. | |
| 2019/0128482 A1 | 5/2019 | Jiang et al. | |
| 2019/0376666 A1 | 12/2019 | Coffy et al. | |
| 2019/0376676 A1 | 12/2019 | Hannan et al. | |
| 2019/0379173 A1 | 12/2019 | Coffy et al. | |
| 2020/0072446 A1 | 3/2020 | Coffy et al. | |

FOREIGN PATENT DOCUMENTS

| | | | | |
|---|---|---|---|---|
| CN | 105229874 A | 1/2016 | | |
| CN | 106663733 A | 5/2017 | | |
| CN | 107210583 A | 9/2017 | | |
| CN | 107251242 A | 10/2017 | | |
| CN | 107608167 A | 1/2018 | | |
| DE | 102017207224 A1 * | 10/2018 | | H01S 5/02296 |
| EP | 1746692 A2 | 1/2007 | | |
| EP | 2677237 A2 | 12/2013 | | |
| EP | 2942561 A1 | 11/2015 | | |
| JP | 2005197142 A | 7/2005 | | |
| WO | 2017/210078 A1 | 12/2017 | | |

OTHER PUBLICATIONS

U.S. Appl. No. 16/432,561, filed Jun. 5, 2019, Protection Mechanism for Light Source.

U.S. Appl. No. 16/432,576, filed Jun. 5, 2019, Protection Mechanism for Light Source.

U.S. Appl. No. 16/552,419, filed Aug. 27, 2019, Protection Mechanism for Light Source.

Ablestik, Technical Data Sheet, Ablebond 8387B, Jul. 2010, 2 pages.

* cited by examiner

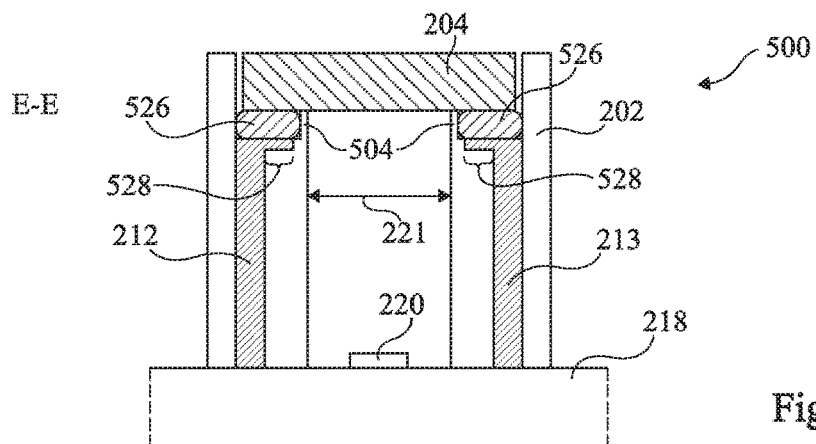
Fig. 5B
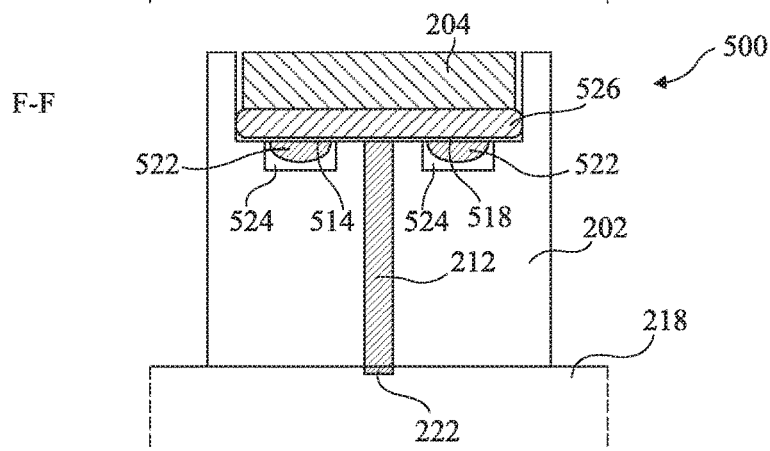
Fig. 5C
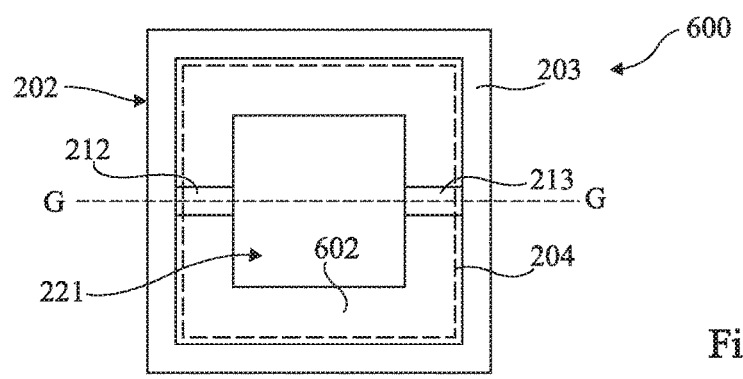
Fig 6A
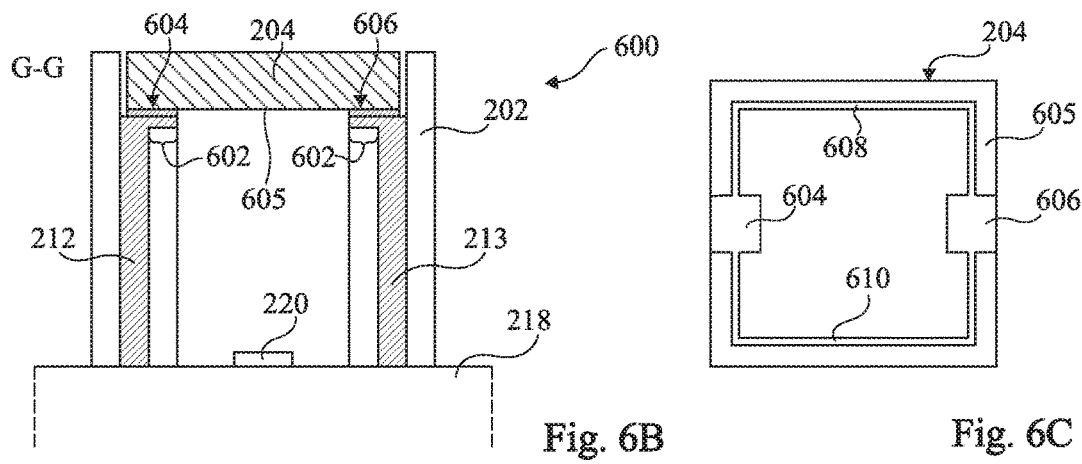
Fig. 6B
Fig. 6C

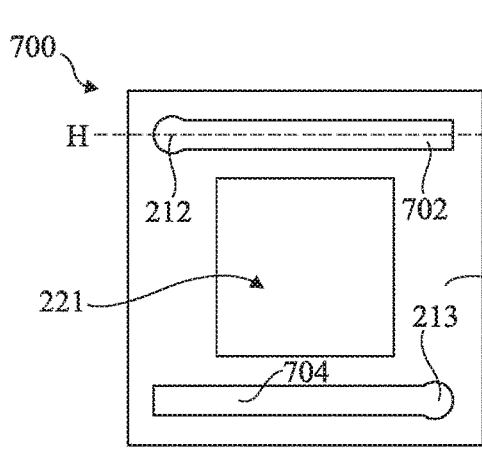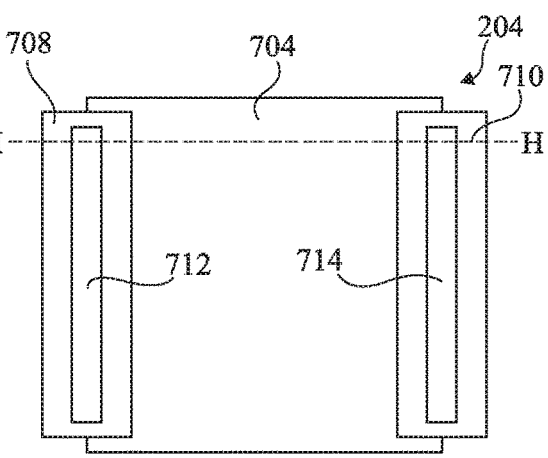
Fig. 7A    Fig. 7B
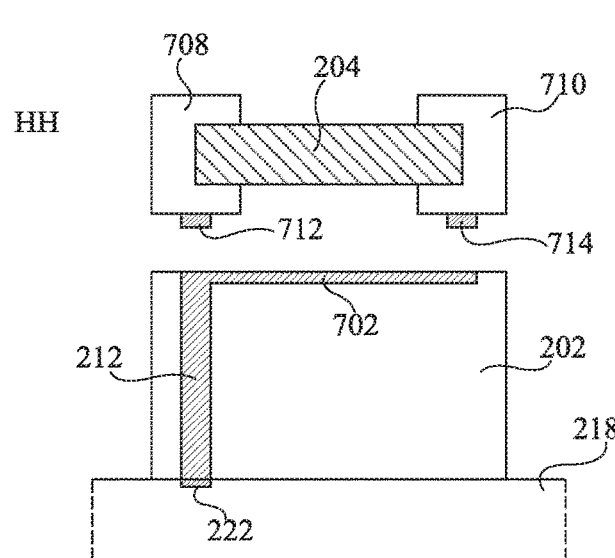
Fig. 7C
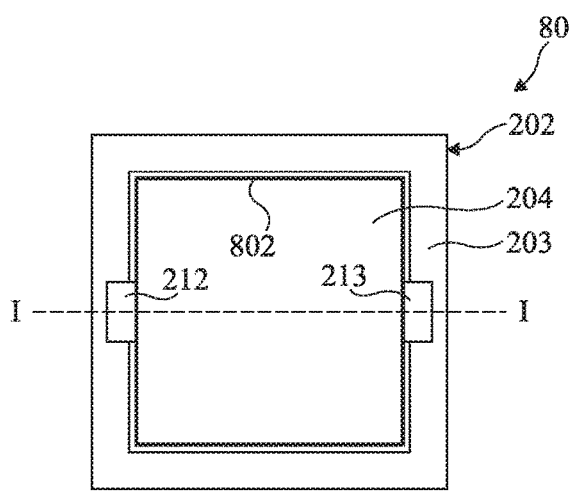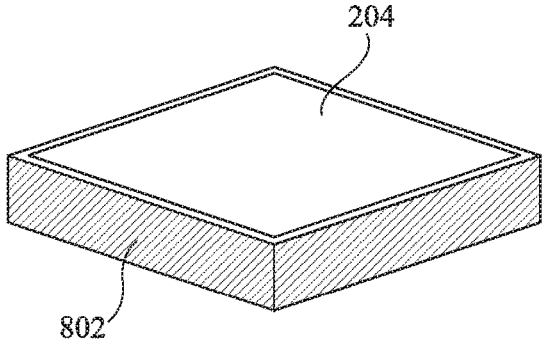
Fig. 8A    Fig. 8B

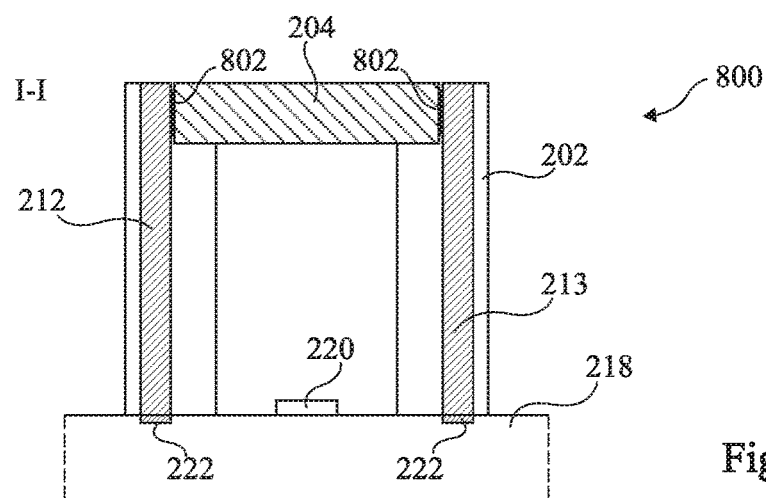
Fig. 8C
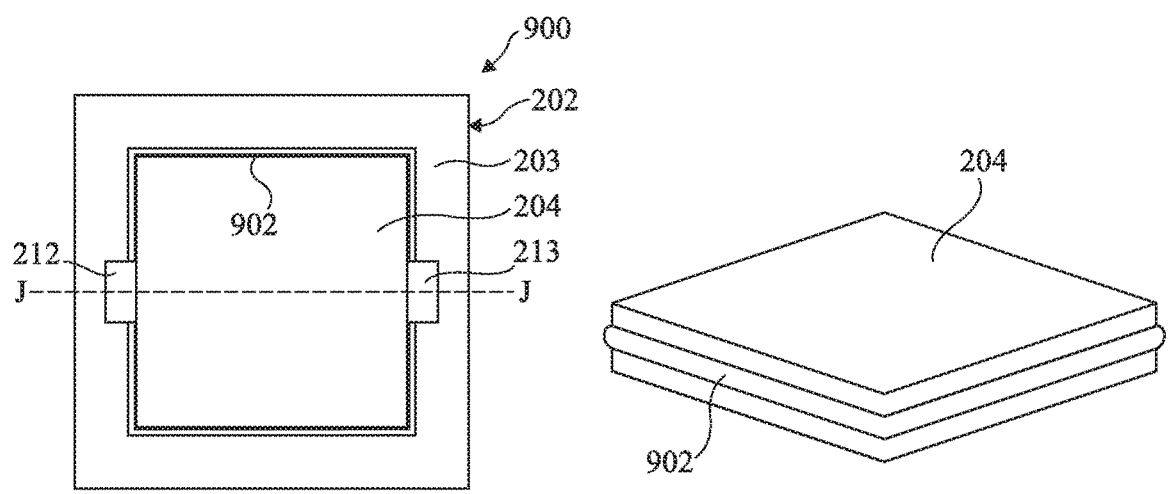
Fig. 9A
Fig. 9B
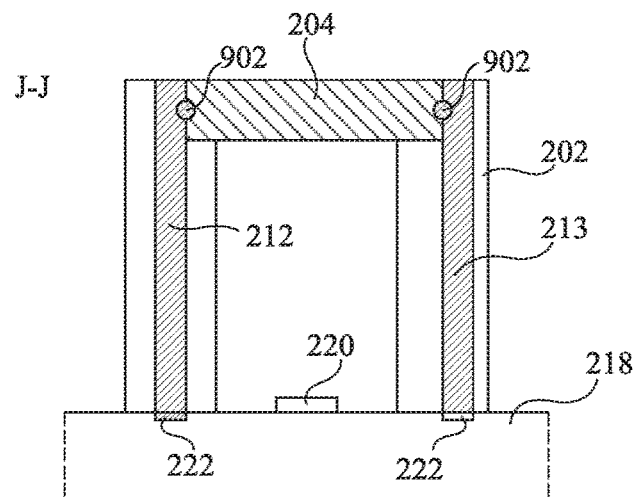
Fig. 9C

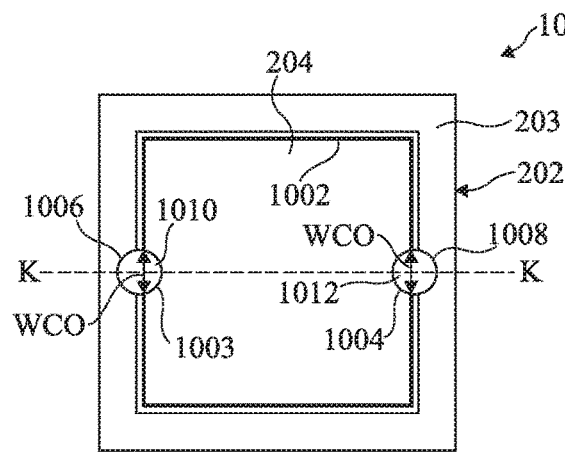
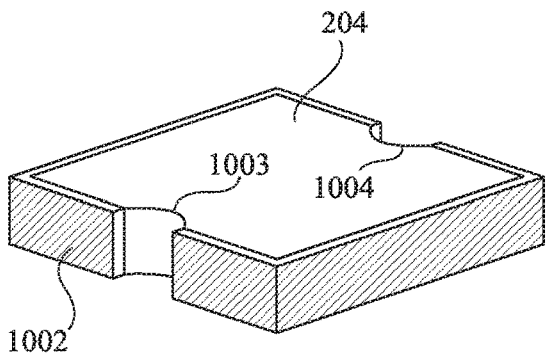
Fig. 10A                    Fig. 10B
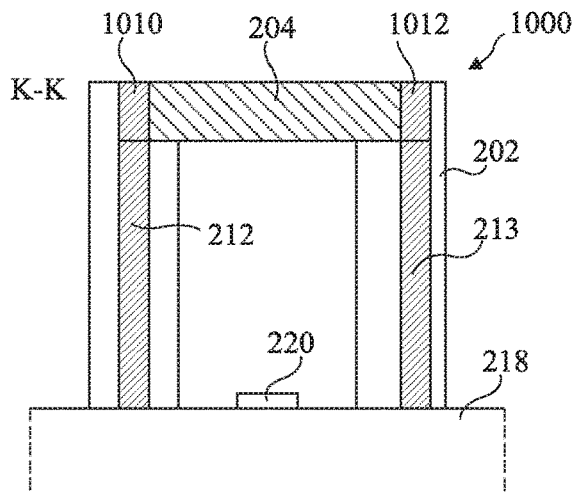
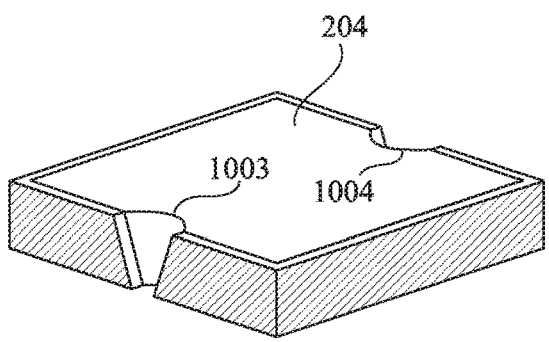
Fig. 10C                    Fig. 10D
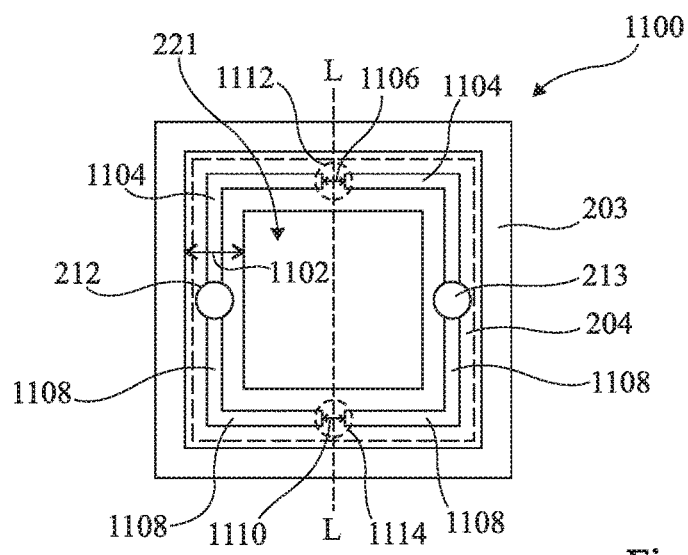
Fig. 11A

PROTECTION MECHANISM FOR LIGHT SOURCE

BACKGROUND

Technical Field

The present disclosure relates to the field of electronic devices comprising light sources, and in particular to a housing for a light source mounted on a substrate.

Description of the Related Art

For certain applications, electronic devices may comprise light sources. For example, ranging devices, such as proximity sensors, often use lasers to generate light beams aimed at one or more objects in an image scene, and the reflected light is used to determine the distance of the object from the ranging device.

The power and type of the light source will depend on the specific application, but generally the higher the power and the narrower the light beam, the greater the distance that can be measured.

The light source used to generate the light beam is generally covered by a diffuser that spreads the beam and thereby reduces to some extent its intensity. As such, the light beam is generally not considered harmful to the user. However, if the diffuser is detached, broken, or otherwise removed from the device, the intensity of the light source may be such that it risks causing harm, for example to a user's eyes.

There is a need for a technical solution for reducing the risk of harm in electronic devices comprising such light sources.

BRIEF SUMMARY

According to one aspect, there is provided a housing for a light source mounted on a substrate, the housing comprising: a barrel comprising a mounting for a diffuser; and a diffuser positioned in the mounting, the barrel comprising: first and second conducting columns; and a fuse electrically coupling the first and second conducting columns, a portion of the fuse being mechanically fixed to the diffuser and/or the fuse being arranged to trap the diffuser in the mounting.

According to one embodiment, the fuse has a diameter or thickness of less than 25 µm.

According to one embodiment, the fuse is a wire arranged to trap the diffuser in said mounting.

According to one embodiment, the fuse is fixed to the diffuser by glue.

According to one embodiment, the fuse is arranged to traverse or bridge a recess in a surface of the barrel, the recess being partially filled with glue in contact with an underside of the diffuser.

According to one embodiment, the fuse is a wire that is soldered at each end to the first and second conducting columns.

According to one embodiment, the fuse is made of gold or copper.

According to one embodiment, the barrel comprises, at one end, a surface for contacting the substrate, the first and second conducting columns extending between the surface for contacting the substrate and a surface of said mounting.

According to a further aspect, there is provided an electronic device comprising a substrate having a light source mounted thereon, the light source being housed in the above housing.

According to a further aspect, there is provided a method of fabricating a housing for a light source to be mounted on a substrate, the method comprising: providing a barrel comprising a mounting for a diffuser, the barrel comprising first and second conducting columns; and fixing the diffuser in the mounting such that a fuse electrically connects the first and second conducting columns and such that a portion of the fuse is mechanically fixed to the diffuser and/or the fuse is arranged to trap the diffuser in the mounting.

According to one aspect, there is provided a housing for a light source mounted on a substrate, the housing comprising: a barrel having first and second conducting columns; and a diffuser having one or more conductive paths arranged to electrically connect the first and second conducting columns when the diffuser is mounted on the barrel.

According to one embodiment, the diffuser comprises a transparent element, and the one or more conductive paths are formed directly on one or more surfaces of the transparent element.

According to one embodiment, the diffuser comprises a transparent element positioned within one or more frame portions, and the one or more conductive paths are formed on one or more surfaces of the frame portions.

According to one embodiment, the one or more conductive paths are conductive coatings formed by sputtering.

According to one embodiment, the one or more conductive paths comprise a wire running around an edge of the diffuser.

According to one embodiment, the one or more conductive paths are formed on one or more sides of the diffuser that are perpendicular to transmission surfaces of the diffuser.

According to one embodiment, the housing further comprises conductive glue electrically connecting the one or more conductive paths to the first and second conducting columns.

According to one embodiment, the barrel comprises, at one end, a surface for contacting the substrate, the first and second conducting columns extending between the surface for contacting the substrate and a surface of a mounting of the diffuser.

According to a further aspect, there is provided an electronic device comprising a substrate having a light source mounted thereon, the light source being housed in the above housing.

According to one embodiment, the electronic device further comprises a circuit configured to supply a supply voltage to the light source via the first and second conducting columns.

According to one embodiment, the electronic device further comprises a circuit configured to supply a supply voltage to the light source via a switch controlled by an activation signal provided via the first and second conducting columns.

According to one embodiment, the electronic device further comprises a circuit configured to detect a detachment of the diffuser from the barrel based on a voltage drop across the first and second conducting columns and to deactivate the light source if the detachment of the diffuser is detected.

According to a further aspect, there is provided a method for fabricating a housing for a light source intended to be mounted on a substrate, the method comprising: providing a barrel having first and second conducting columns; and fixing a diffuser to the barrel, the diffuser comprising one or more conductive paths, and fixing the diffuser to the barrel comprises bringing the one or more conductive paths into electrical contact with the first and second conducting columns such that the first and second conducting columns are electrically connected via the one or more conductive paths.

According to one aspect, there is provided a housing for a light source mounted on a substrate, the housing comprising: a barrel having first and second conducting columns; and a diffuser having a through-hole or partial hole filled with a conductive plug, the conductive plug electrically bridging a gap in an electrical connection between the first and second conducting columns.

According to one embodiment, the conductive plug is made of a conductive glue.

According to one embodiment, the diffuser comprises a transparent element having said through-hole traversing the transparent element.

According to one embodiment, the through-hole is cylindrical.

According to one embodiment, the through-hole is conical.

According to one embodiment, the diffuser comprises a transparent element having the partial hole extending across an edge of the transparent element.

According to one embodiment, the partial hole has the form of part of a cone.

According to one embodiment, the barrel comprises, at one end, a surface for contacting the substrate, the first and second conducting columns extending between the surface for contacting the substrate and a surface of a mounting of the diffuser.

According to a further aspect, there is provided an electronic device comprising a substrate having a light source mounted thereon, the light source being housed in the above housing.

According to a further aspect, there is provided a method of fabricating a housing for a light source intended to be mounted on a substrate, the method comprising: providing a barrel having first and second conducting columns; fixing a diffuser to the barrel; and filling a through-hole traversing the diffuser, or a partial hole formed in an edge of the diffuser, with a conductive material to form a conductive plug, the conductive plug electrically bridging a gap in an electrical connection between the first and second conducting columns.

BRIEF DESCRIPTION OF THE SEVERAL VIEWS OF THE DRAWINGS

The foregoing and other features and advantages will become apparent from the following detailed description of embodiments, given by way of illustration and not limitation with reference to the accompanying drawings, in which:

FIG. 5B is a cross-section view of the housing of FIG. 5A according to an example embodiment;

FIG. 5C is a further cross-section view of the housing of FIG. 5A according to an example embodiment;

FIG. 6A is a plan view of a housing for a light source according to yet a further example embodiment of the present disclosure;

FIG. 6B is a cross-section view of the housing of FIG. 6A according to an example embodiment;

FIG. 6C is a plan view of the underside of a diffuser of the housing of FIG. 6A according to an example embodiment;

FIG. 7A is a plan view of a housing for a light source according to yet a further example embodiment of the present disclosure;

FIG. 7B is a plan view of a diffuser for use with the housing of FIG. 7A according to an example embodiment;

FIG. 7C is a cross-section view of the housing of FIG. 7A and of the diffuser of FIG. 7B according to an example embodiment;

FIG. 8A is a plan view of a housing for a light source according to yet a further example embodiment of the present disclosure;

FIG. 8B is a perspective view of a diffuser of the housing of FIG. 8A according to an example embodiment;

FIG. 8C is a cross-section view of the housing of FIG. 8A according to an example embodiment;

FIG. 9A is a plan view of a housing for a light source according to yet a further example embodiment of the present disclosure;

FIG. 9B is a perspective view of a diffuser of the housing of FIG. 9A according to an example embodiment;

FIG. 9C is a cross-section view of the housing of FIG. 9A according to an example embodiment;

FIG. 10A is a plan view of a housing for a light source according to yet a further example embodiment of the present disclosure;

FIG. 10B is a perspective view of a diffuser of the housing of FIG. 10A according to an example embodiment;

FIG. 10C is a cross-section view of the housing of FIG. 10A according to an example embodiment;

FIG. 10D is a perspective view of the diffuser of the housing of FIG. 10A according to an alternative embodiment to that of FIG. 10B;

FIG. 11A is a plan view of a housing for a light source according to yet a further example embodiment of the present disclosure;

Throughout the various figures, like features have been referenced with like reference numerals.

DETAILED DESCRIPTION

Throughout the present disclosure, the term "connected" is used to designate a direct electrical connection between circuit elements, whereas the term "coupled" is used to designate an electrical connection between circuit elements that may be direct, or may be via one or more intermediate elements such as resistors, capacitors, transistors or buffers. Unless indicated otherwise, when the term "coupled" is used, the connection can be implemented by a direct connection.

The term "approximately" is used herein to designate a tolerance of plus or minus 10% of the value in question.

Throughout the present disclosure, the term "barrel" is used to designate an element having a generally tubular form, which for example has a substantially square or round cross-section, although other shapes would also be possible.

The term "diffuser" is used to designate any element formed of a material that is relatively transparent to the wavelengths of the light beam that it is to diffuse. For example, a diffuser has a transmission rate of 90 percent or more for these wavelengths. A diffuser may be formed of a solid single material, or may be formed by assembling multiple materials, in which case only part of the diffuser may be transparent. For example, the diffuser is formed of glass or plastic. The transmission surfaces of the diffuser are for example planar. Alternatively, either or both of the transmission surfaces could be non-planar in order to enhance the diffusion effect and/or to perform other optical functions.

Figure 1A:
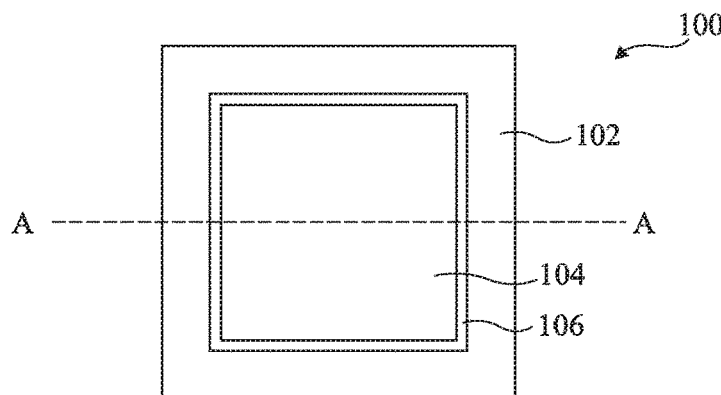
FIG. 1A is a plan view of a housing for a light source.

FIG. 1A is a plan view of a housing 100 for a light source. The housing 100 for example comprises a housing body or a barrel 102 in which a diffuser 104 is mounted. For example, the diffuser 104 is fixed to the barrel 102 by a glue 106 filling partially or entirely a gap between the diffuser 104 and the barrel 102.

Figure 1B:
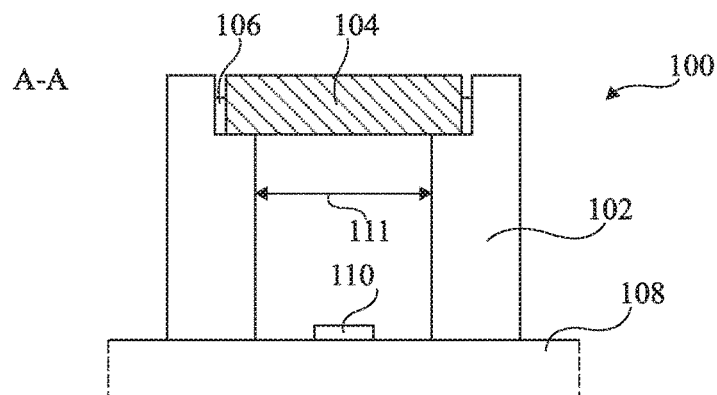
FIG. 1B is a cross-section view of the housing of FIG. 1A.

FIG. 1B is a cross-section view of the housing 100 taken along a dashed line A-A in FIG. 1A that traverses the barrel 102 and the diffuser 104. As illustrated, the housing 100 is for example positioned on a substrate 108 such that it covers a light source 110 also mounted on the substrate 108. The light source 110 is for example a laser source, or other type of source capable of emitting a light beam, such as a vertical-cavity surface-emitting laser (VCSEL). For example, the light source 110 has a power in the range 0.2 W to 2 W.

The barrel 102 comprises an opening 111 through its middle permitting the passage of a light beam generated by the light source 110.

As explained in the background section above, the diffuser 104, which is for example made of glass, performs a role of protecting the light source 110 from dust and of diffusing, and thus reducing in intensity, the light beam generated by the light source 110. A difficulty is that if the diffuser 104 is removed or otherwise becomes detached from the barrel 102, for example because of the failure of the glue 106, the light source 110 will no longer be covered, exposing a user to the full intensity of the light beam.

Housings for a light source and methods of fabricating the same according to a first aspect of the present disclosure will now be described with reference to FIGS. 2 to 5. The structure and function of elements as shown in FIGS. 2 to 5 are the same as those discussed above unless indicated otherwise.

According to the first aspect, the housing comprises a conductive wire, strip or trace, which will be referred to herein as a fuse, and which is arranged to be broken if the diffuser is removed or otherwise becomes detached from the housing. The term "fuse" is used because this wire, strip or trace is designed to break an electrical connection in order to provide a protection mechanism. In particular, the fuse is configured to break in the event of a mechanical force caused by the detachment of the diffuser. The fuse may or may not have the additional property of melting in case of excess current, which in any case is not its primary role. In each embodiment, the fuse for example has a diameter or thickness of 25 μm or less, and for example of 15 μm or less, thereby rendering it relatively fragile and likely to break if the diffuser is detached. The fuse is for example formed of copper or gold.

Figure 2A:
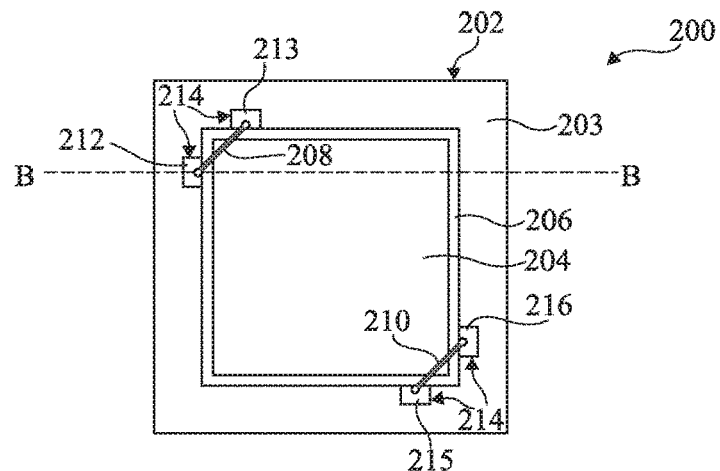
FIG. 2A is a plan view of a housing for a light source according to an example embodiment of the present disclosure.

FIG. 2A is a plan view of a housing 200 for a light source according to an example embodiment of the present disclosure. Like the housing 100 of FIG. 1A, the housing 200 comprises a barrel 202, of which the top surface 203 is visible in FIG. 2A, and a diffuser 204 mounted on and/or in the barrel 202. In the embodiments described herein, the barrel 202 is square in cross-section, although in alternative embodiments other shapes would be possible. The diffuser 204 is for example positioned within a mounting formed in a top surface of the barrel 202, and is fixed in its mounting by glue 206 filling a gap between the diffuser 204 and the barrel 202.

Wire fuses 208, 210 are for example positioned to retain the diffuser 204 within its mounting in or on the barrel 202. In the example of FIG. 2A, the wire fuses 208, 210 extend over corners at perimeter portions of the diffuser 204. The ends of the wire fuse 208 are for example soldered to exposed top surfaces of conducting columns 212 and 213, which are for example visible in FIG. 2A through openings 214 in the barrel 202. Similarly, the ends of the wire fuse 210 are for example soldered to exposed top surfaces of conducting columns 215 and 216, which are for example also visible in FIG. 2A through openings 214 in the barrel 202.

In some embodiments, the wire fuses 208, 210 are each covered by a protective coating, such as a black glue, in order to protect them from accidental damage that is not provoked by the detachment of the diffuser 204.

Figure 2B:
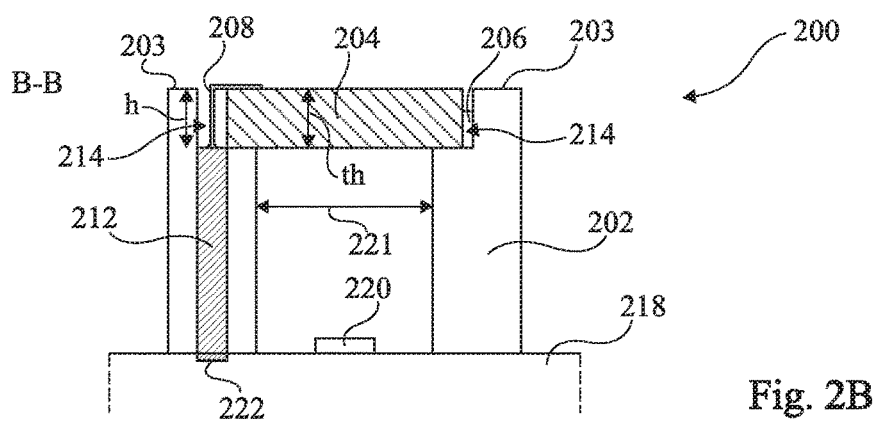
FIG. 2B is a cross-section view of the housing of FIG. 2A according to an example embodiment.

FIG. 2B is a cross-section view taken along a dashed line B-B of FIG. 2A passing through the conducting column 212 and across the diffuser 204. In the cross-section of FIG. 2B, it is assumed that the view of FIG. 2A is of the top of the housing 200. As illustrated, the housing 200 is for example mounted on a substrate 218, covering a light source 220 similar to the light source 110 of FIG. 1B described above. The barrel 202 comprises an opening 221 through its middle permitting the passage of a light beam generated by the light source 220.

The conducting column 212 extends, within the wall of the barrel 202, from an underside of the housing 200 that contacts the substrate 218 up to the level of the diffuser 204. The other conducting columns 213, 215 and 216 (not illustrated in the view of FIG. 2B) are for example similar to the column 212. The conducting columns 212, 213, 215, 216 are for example formed of copper, aluminum or of another conducting material such as a metal or metal alloy.

A bottom surface of the conducting column 212 is for example in electrical contact with a pad 222 formed in the surface of the substrate 218. The other conducting columns 213, 215, 216 are for example in contact with similar pads (not illustrated in the view of FIG. 2B).

The wire fuse 208 extends from the top surface of the conducting column 212 over a corner of the diffuser 204. The diffuser 204 is for example positioned in a mounting formed by a recess of height h in the top surface of the barrel 202. The height h is for example approximately equal to the thickness $t_h$ of the diffuser 204. A control circuit, described in more detail below, is for example implemented on and/or in the substrate 218 and is coupled to the conducting columns 212, 213, 215 and 216 via corresponding pads 222. When the diffuser 204 is in position and the wire fuses 208 and 210 are intact, the conducting columns 212 and 213 and wire fuse 208 form a first conductive loop, and the conducting columns 215 and 216 and wire fuse 210 form a second conductive loop. If, however, the diffuser 204 becomes detached, the wire fuse 208 and/or 210 will be broken, leading to an open circuit in either or both of the conductive loops. The control circuit for example periodically or continuously tests the conductive loops by passing a current through them, and deactivates the light source 220 if an open circuit is detected in either or both of the conductive loops.

Figure 2C:
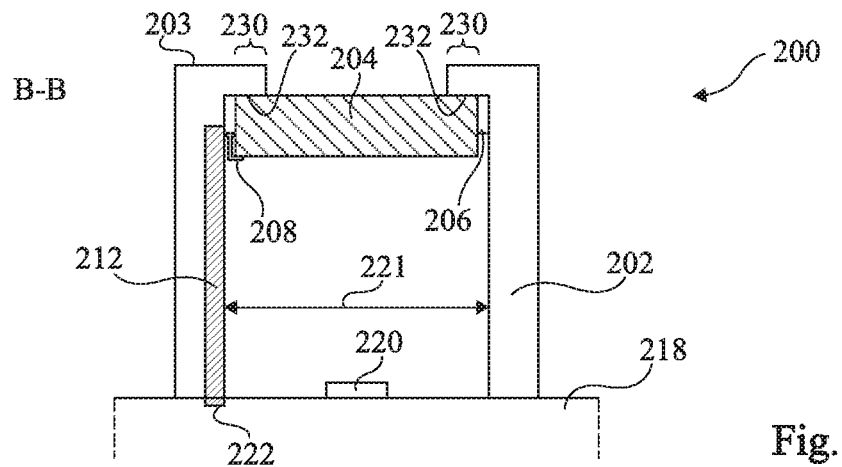
FIG. 2C is a cross-section view of the housing of FIG. 2A according to a further example embodiment.

FIG. 2C is a cross-section view taken along the line B-B of FIG. 2A according to an alternative embodiment to that of FIG. 2B. Like features in FIGS. 2B and 2C have been labelled with like reference numerals and will not be described again in detail. In the cross-section view of FIG. 2B, it is assumed that the view of FIG. 2A is of the underside of the housing 200. Thus, in the example of FIG. 2C, the diffuser 204 is mounted within the barrel 202, rather than sitting in a recess formed in the top surface of the barrel 202.

For example, the barrel 202 comprises, at its top end, a lip 230 extending towards an axis of the barrel 202. The diffuser 204 is for example held against an underside 232 of this lip 230, and fixed in place by glue 206 between the edges of the diffuser 204 and the inside surface of the barrel 202. The conducting column 212 is for example formed on the inner surface of the barrel 202, and in some embodiments is formed as a surface plating, such as by the technique known as LDS (laser direct structuring). The wire fuse 210 is for example soldered to a lateral side of the conducting column 212, and extends across a corner of the underside of the diffuser 204, where it is soldered in a similar manner to the column 213 (not illustrated in FIG. 2C). The wire fuses 208 and 210 therefore retain the diffuser 204 in its mounting in the barrel 202, and are positioned such that they are likely to be broken if the diffuser 204 is detached from the barrel 202.

It will be apparent to those skilled in that art that, while FIGS. 2A, 2B and 2C illustrate embodiments in which there are two wire fuses 208, 210 and four conducting columns 212, 213, 215 and 216, in some embodiments only one of the wire fuses 208, 210 could be provided, and the number of conducting columns could be reduced to two. In such a case, the wire fuse for example extends over the entire width or length of the diffuser in order to avoid the risk that the diffuser could be removed without breaking the wire fuse. Alternatively, additional wires fuses and conducting columns could be provided, for example one positioned at each corner of the diffuser 204.

Figure 3A:
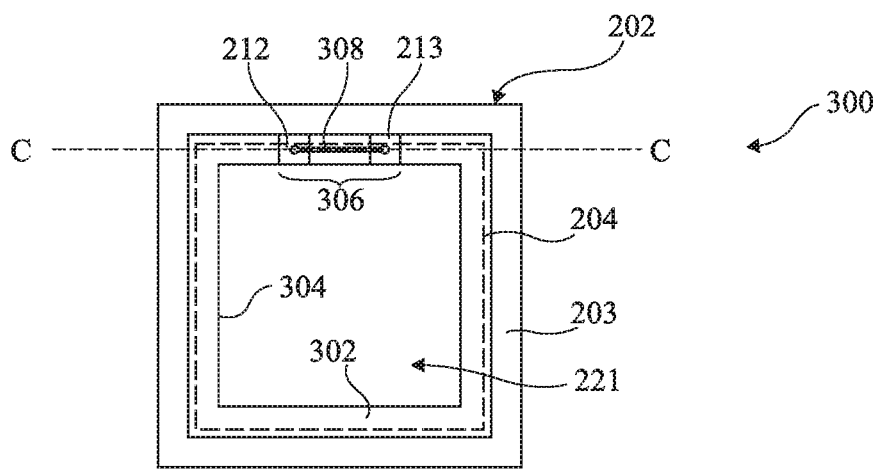
FIG. 3A is a plan view of a housing for a light source according to a further example embodiment of the present disclosure.

FIG. 3A is a plan view of a housing 300 for a light source according to a further example embodiment of the present disclosure. In FIG. 3A, the position of the diffuser 204 on the barrel 202 is represented by a dashed rectangle. Like in the embodiment of FIG. 2B, the diffuser 204 is positioned in a recess in the top surface 203 of the barrel 202 with glue 318. The recess for example comprises a surface 302, substantially parallel to the top surface 203 of the barrel 202, and extending outwards from the inner surface 304 extending up the middle of the barrel 202. The surface 302 is interrupted by a deeper recess 306 on one side, in which the top surfaces of conducting columns 212 and 213 are visible. A wire fuse 308 for example extends, in this recess 306, between the top surfaces of the conducting columns 212, 213, and is for example soldered to each of the top surfaces of the conducting columns 212, 213 in order to electrically connect the columns 212 and 213 together. The wire fuse 308 is located at a perimeter portion of the diffuser 204

Figure 3B:
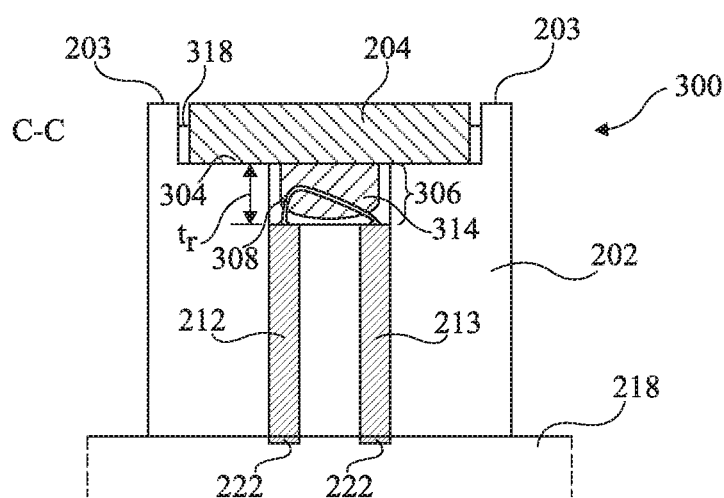
FIG. 3B is a cross-section view of the housing of FIG. 3A according to an example embodiment.

FIG. 3B is a cross-section view of the housing 300 of FIG. 3A taken along a line C-C running through the barrel 202 and through the recess 306 and the wire fuse 308. The wire fuse 308 for example passes through a glue spot 314 that is stuck to the underside of the diffuser 204. Thus, if the diffuser 204 becomes detached from the barrel 202, the glue spot 314 will go with the diffuser 204, thereby breaking the fuse 308. In some embodiments, the glue spot 314 does not contact one, some or all of the surfaces of the recess 306, thereby reducing the risk that the glue spot 314 remains in the recess 306 if the diffuser 204 is detached. The recess 306 for example has a depth $t_r$ of between 0.5 and 1 mm.

A method of fabricating the housing 300 for example involves forming the barrel 202 including the wire fuse 308 connecting the conducting columns 212, 213. The glue spot 314 is then deposited on the underside of the diffuser 204 in the appropriate position, and the diffuser 204 is then positioned in its mounting in the barrel 202 before the glue has hardened, such that the wire fuse enters the glue spot 314. The glue spot 314 for example hardens by cooling, by exposure to air, or by activation, for example using UV light. Additional glue is for example used to fix the diffuser 204 to the barrel 202.

While in the embodiment of FIGS. 3A and 3B there is a single pair of conducting columns 212, 213 and a single wire fuse 208, in alternative embodiments there could be one or more additional pairs of conducting columns linked by additional wire fuses positioned in further recesses similar to the recess 306, for example formed in other sides of the barrel 202.

Figure 4A:
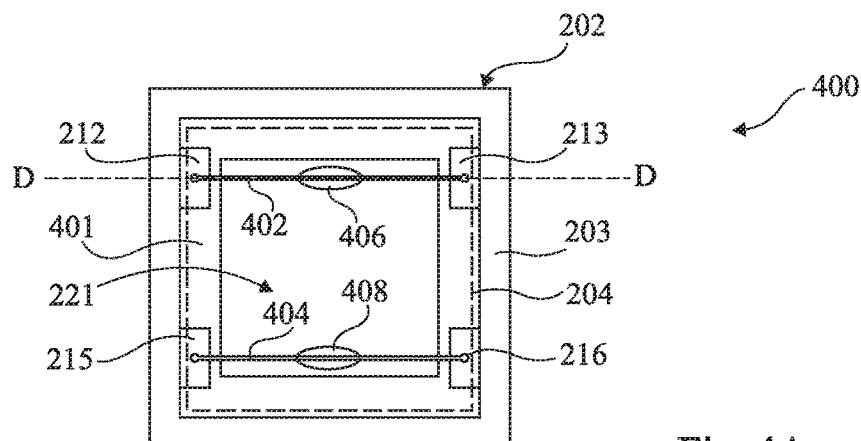
FIG. 4A is a plan view of a housing for a light source according to an example embodiment of the present disclosure.

FIG. 4A is a plan view of a housing 400 for a light source according to a further example embodiment.

An arrow 221 in FIG. 4A designates the opening running up the middle of the barrel 202 and permitting the passage of the light beam generated by the light source. In the example of FIG. 4A, the barrel 202 comprises two pairs of conducting columns, a first pair 212, 213 positioned on opposite sides of the opening 221, and a second pair 215, 216 also positioned on the same opposite sides of the opening 221. The top surfaces of the conducting columns 212, 213, 215 and 216 are for example substantially flush with a surface 401 recessed with respect to the top surface 203 of the barrel 202. A wire fuse 402 electrically connects the conducting columns 212, 213, and its ends are for example soldered to the top surfaces of these columns. A wire fuse 404 electrically connects the conducting columns 215, 216, and its ends are for example soldered to the top surfaces of these columns. Each of the wire fuses 402, 404 is for example attached to an underside of the diffuser 204 by a corresponding glue spot 406, 408. More particularly, the wire fuses 402, 404 are attached to an underside of the diffuser 204 at opposing perimeter portions of the diffuser.

Figure 4B:
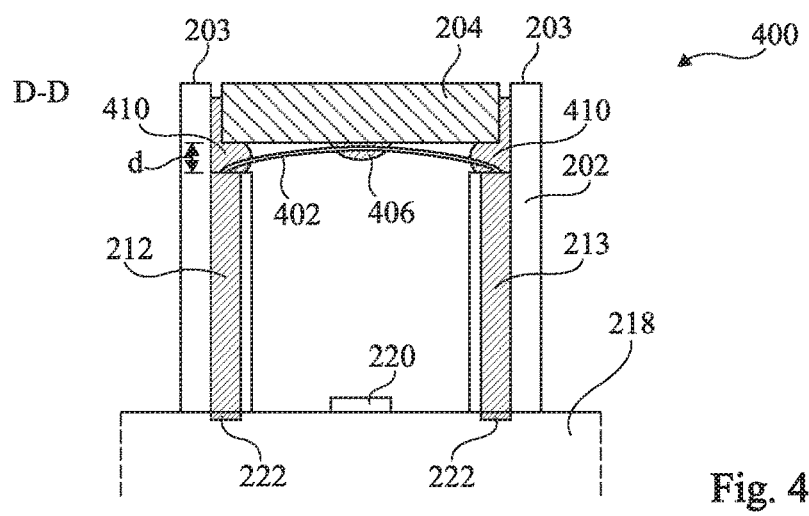
FIG. 4B is a cross-section view of the housing of FIG. 4A according to an example embodiment.

FIG. 4B is a cross-section view of the housing of FIG. 4A taken along a line D-D running through the conducting columns 212, 213, through the wire fuse 402 and through the glue spot 406. As illustrated, there is for example a gap between the top surfaces of the columns 212, 213 and the underside of the diffuser 204, which is filled with glue 410 used to fix the diffuser in its mounting in the barrel 202.

A method of fabricating the housing 400 for example involves forming the barrel 202 with the wire fuses 402 and 404 soldered between the conducting columns 212, 213. The glue spots 406 and 408 are then for example deposited on the underside of the diffuser 204 in appropriate positions. The diffuser 204 is then positioned in its mounting in the barrel 202 before the glue has hardened, such that the wire fuses 402, 404 enter the glue spots 406, 408 respectively. The glue spots 406, 408 for example harden by cooling, by exposure to air, or by activation, for example using UV light. The additional glue 410 is for example deposited on the recessed surface 404 as the diffuser is placed within its mounting in order to fix the diffuser 204 to the barrel 202.

Figure 5A:
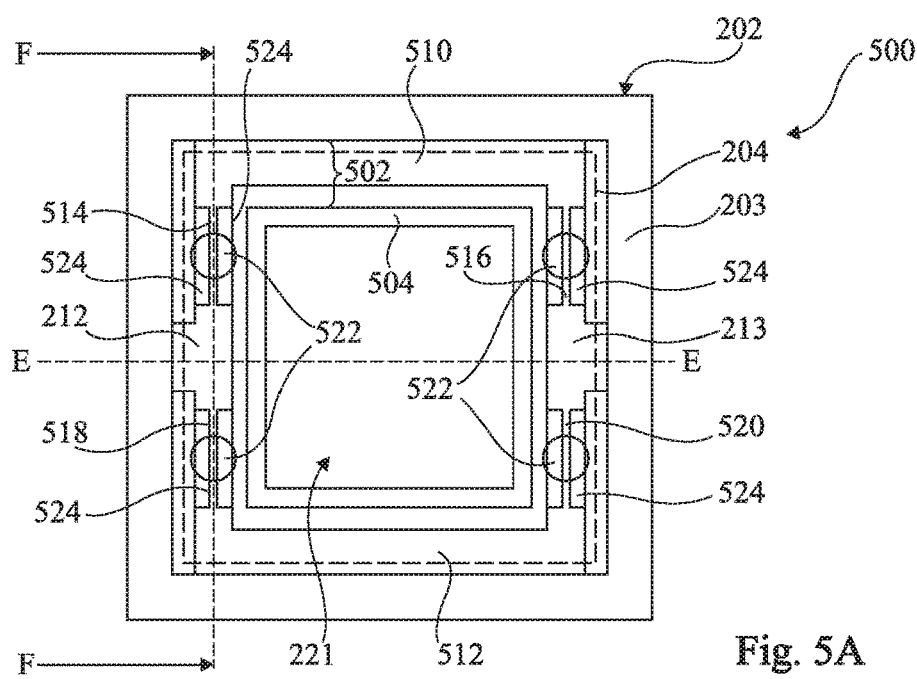
FIG. 5A is a plan view of a housing for a light source according to yet a further example embodiment of the present disclosure.

FIG. 5A is a plan view of a housing 500 for a light source according to yet a further example embodiment.

In the example of FIG. 5A, the top side of the barrel 202 comprises a recessed zone 502 extending around the barrel between a lip 504 formed adjacent to the opening 221 and the top surface 203 of the barrel 202. The conducting columns 212, 213 are visible in the recessed zone on opposite sides of the opening 221, and a conductive track is for example formed in this recess running around the barrel and electrically connecting the conducting columns 212, 213. This conductive track for example comprises conducting strips 510 and 512 running along the sides of the barrel 202 that do not comprise the columns 212, 213, and fuses 514, 516, 518 and 520. The fuses 514, 516, 518 and 520 are for example in the form of conductive strips or traces formed on the barrel 202. For example, the fuse 514 connects the conducting column 212 to the conducting strip 510, the fuse 516 connects the conducting strip 510 to the conducting column 213, the fuse 518 connects the conducting column 212 to the conducting strip 512 and the fuse 520 connects the conducting strip 512 to the conducting column 213. A corresponding glue spot 522 fixes a portion of each fuse to the underside of the diffuser 204. Furthermore, in some embodiments, each of the fuses 514 to 520 is suspended over a corresponding recess 524 in the zone 502.

FIG. 5B is a cross-section view illustrating the housing 500 taken along a dashed line E-E of FIG. 5A extending across the barrel 202 and traversing the conducting columns 212 and 213. In the example of FIG. 5B, the tops of the conducting columns 212, 213 for example comprise overhanging regions 528 such that the top surface of the columns 212, 214 is wider than the rest of the conducting columns. Furthermore, the diffuser 204 for example rests on the top of the lip 504, and this lip 504 for example serves to maintain a bead of glue 526 in the recessed zone 502.

FIG. 5C is a cross-section view of the housing 500 taken along a dashed line F-F in FIG. 5A extending across a wall of the barrel 202 through the fuses 514, 518 and through the conducting column 212. As illustrated, the glue spots 522 through which each of the fuses passes for example correspond to portions of the glue bead 526 that have partially entered the recesses 524. By choosing an appropriate volume of glue, the size of the glue spots 522 can for example be selected such that the glue has relatively low contact with the edges of the recesses 524. In this way, there is less risk that the glue will remain stuck to the barrel 202 if the diffuser 204 becomes detached.

An advantage of the use of one or more fuses as described in relation with FIGS. 2 to 5 is that they provide relatively low cost and reliable mechanisms for breaking an electrical connection in case of detachment of the diffuser.

Housings for a light source and methods of fabricating the same according to a second aspect of the present disclosure will now be described with reference to FIGS. 6 to 9. The structure and function of elements as shown in FIGS. 6 to 9 are the same as those discussed above unless indicated otherwise.

According to the second aspect, conducting columns formed in the barrel of the housing are electrically connected by contacting a conductive coating formed on the diffuser 204.

FIG. 6A is a plan view of a housing 600 for a light source according to an example embodiment. Like in the embodiments of FIGS. 2 to 5, the diffuser 204 is positioned in a mounting, and rests on a region 602 that is recessed with respect to the top surface 203 of the barrel 202.

FIG. 6B is a cross-section view of the housing 600 taken along a dashed line G-G shown in FIG. 6A passing through the barrel 202, and through the conducting columns 212, 213. Like in the embodiment of FIG. 5B, the tops of the conducting columns 212, 213 for example comprise overhanging regions 602 such that the top surfaces of the columns 212, 214 are wider than the rest of the conducting columns. The top surface of the conducting column 212 for example makes an electrical connection with a contact 604 formed on the underside 605 of the diffuser 204. Similarly, the top surface of the conducting column 213 for example makes an electrical connection with a contact 606 formed on the underside 605 of the diffuser 204. In some embodiments, the respective electrical connections between the columns 212, 213 and contacts 604, 606 result only from direct physical contact between the surfaces, while in other embodiments the surfaces may be fixed together using a conductive glue.

FIG. 6C is a plan view of the underside 605 of the diffuser 204 according to an example embodiment. The contacts 604 and 606 are for example square, although other shapes would be possible. In the embodiment of FIG. 6C, the contacts 604 and 606 are electrically connected by a pair of conductive tracks 608 and 610 running close to the edges of the diffuser 204 so as to avoid interfering with the light beam passing through a central portion of the diffuser. The contacts 604, 606 and tracks 608, 610 are for example implemented by a same conductive coating, formed for example using a photolithography process. The conductive coating is for example of copper, gold, ITO (Indium Tin Oxide) or of another metal or a metal alloy.

FIG. 7A is a plan view of a housing 700 according to a further example embodiment, without the diffuser in place. The barrel 202 for example comprises conducting columns 212 and 213. The column 212 is coupled to a conducting track 702 running along the top surface 203 of the barrel 202. Similarly, the column 213 is coupled to a conducting track 704 running along the top surface 203 of the barrel 202. For example, the barrel 202 is square-shaped and the conducting tracks 702, 704 for example run, substantially in parallel with each other, along opposite sides of the barrel 202 with respect to the opening 221 in the middle of the barrel 202.

FIG. 7B is a plan view of the underside of the diffuser 204. In this example, the diffuser 204 comprises a window 706 formed of a transparent material, such as glass, and partial frame portions 708 and 710 fixed to edges of the window 706. For example, the partial frame portions have been over-molded to the window 706. Each of the partial frame portions 708, 710 for example has a conducting track 712, 714 respectively running along it, the tracks 712, 714 being substantially parallel to each other.

FIG. 7C is a cross-section view of the barrel 202 and of the diffuser 204 taken along a dashed line H-H of FIG. 7A that passes through the conducting column 212 and along the conducting track 702. When assembled, the conducting tracks 702 and 704 for example run substantially perpendicular to the conducting tracks 712 and 714 and the tracks 702 and 704 contact the tracks 712 and 714 near their extremities. In some embodiments, the partial frame portions 708, 710 of the diffuser 204 are glued to the top surface 203 of the barrel 202, and physical contact between the tracks 702, 704 and the tracks 712, 714 assures the electrical connections. In alternative embodiments, a conductive glue may be used to connect the tracks 712 and 714 to the tracks 702 and 704. Thus the conductive tracks 712, 714 of the diffuser 204 for example form an electrical connection between the tracks 702 and 704 when the diffuser 204 is in place fixed to the barrel 202. If, however, the diffuser 204 becomes detached from the barrel 202, the connection will be lost.

FIG. 8A is a plan view of housing 800 for a light source according to yet a further example embodiment. In the example of FIG. 8A, the conducting columns 212 and 213 are formed in opposite sides of the barrel 202, and for example extend substantially to the top surface 203 of the barrel 202. The columns 212, 213 are electrically connected together by a conductive coating 802 formed on the edges of the diffuser 204.

FIG. 8B illustrates the diffuser 204 in more detail. It can be seen that the conductive coating 802 for example extends around the entire edge of the diffuser 204. This coating is for example formed by sputtering. In some embodiments, the coating is formed of copper, gold, aluminum or another metal or metal alloy.

FIG. 8C is a cross-section view of the housing 800 taken along a line I-I shown in FIG. 8A traversing the barrel 202 through the conducting columns 212 and 213. It can be seen that the conducting columns 212 and 213 for example extend to a level substantially flush with the top of the diffuser 204, leading to a relatively high contact area between the electrical coating 802 on the diffuser 204 and the conducting columns 212, 213. In some embodiments, a conductive glue may additionally be used to electrically connect the conducting columns 212, 213 to the coating 802.

FIG. 9A is a plan view of housing 900 for a light source according to yet a further example embodiment that is similar to that of FIG. 8A. However, the conductive coating 802 of FIG. 8A is replaced in FIG. 9A by a conductive wire 902.

FIG. 9B is a perspective view of the diffuser 204 of FIG. 9A, and illustrates the wire 902 in more detail. The wire 902 is for example wrapped entirely around the edge of the diffuser 204. In some embodiments, the wire sits in a groove formed in the edge of the diffuser 204.

FIG. 9C is a cross-section view of the housing 900 taken along a line J-J shown in FIG. 9A traversing the barrel 202 through the conducting columns 212 and 213. In some embodiments, the wire 902 is sandwiched between the edges of the diffuser 204 and the edges of the conducting columns 212, 213, ensuring a relatively good electrical connection there-between. In some embodiments, a conductive glue can be used to improve the electrical connection.

An advantage of the use of conductive tracks on the diffuser 204 in order to create an electrical connection between the conducting columns passing through the barrel is that the conductive tracks can be formed relatively cheaply. Furthermore, because these conductive tracks form part of the diffuser 204, the electrical connection can be reliably broken in case of detachment of the diffuser 204.

Housings for a light source and methods of fabricating the same according to a third aspect of the present disclosure will now be described with reference to FIGS. 10 and 11.

The structure and function of elements as shown in FIGS. 10 and 11 are the same as those discussed above unless indicated otherwise.

According to the third aspect, conducting columns formed in the barrel of the housing are electrically connected by conductive tracks, and by a conductive plug attached to the diffuser.

FIG. 10A is a plan view of a housing 1000 for a light source according to an example embodiment. The diffuser 204 is similar to that of the embodiments of FIGS. 8A to 8C, except that the conductive coating 1002 on the edges of the diffuser 204 is interrupted by gaps resulting for example from partial holes 1003, 1004 or recesses formed in edges of the diffuser 204 in regions above the conducting columns 212, 213 (not illustrated in FIG. 10A). By "partial hole", it is meant a hole that extends across the whole thickness of the diffuser 204, but which overlaps an edge of the diffuser 204. Each partial hole 1003, 1004 is for example substantially semi-cylindrical and has a width $w_{co}$ of between 0.1 and 1 mm. Furthermore, the top surface 203 of the barrel 202 comprises similar partial holes 1006, 1008 aligned with those of the diffuser 204 so as to form holes or voids, which are for example substantially cylindrical. The holes or voids are filled with a conductive material to form conductive plugs 1010, 1012. For example, the plugs 1010, 1012 are formed of a conductive glue.

FIG. 10B is a perspective view of the diffuser 204 of FIG. 10A according to an example embodiment. The partial holes 1003, 1004 are for example formed by first depositing the conductive coating 1002 around the entire edge of the diffuser 204, and then locally filing or drilling to form the partial holes 1003, 1004.

FIG. 10C is a cross-section view of the housing 1000 taken along a line K-K shown in FIG. 10A traversing the barrel 202 through the conductive plugs 1010 and 1012. It can be seen that the plugs 1010 and 1012 assure an electrical connection between the coating 1002 and the conducting columns 212 and 213 respectively. Thus, if the diffuser 204 becomes detached from the barrel 202, the electrical connection between the conducting columns 212, 213 will be broken.

While FIGS. 10A and 10B provide examples of partial holes that are semi-cylindrical in shape, it will be apparent to those skilled in the art that other shapes for the partial holes and conductive plugs 1010, 1012 would be possible, an example of which will now be described with reference to FIG. 10D.

FIG. 10D is a perspective view of the diffuser 204 of FIG. 10A according to a further example embodiment in which the partial holes 1003 and 1004 are no longer semi-cylindrical, but semi-conical instead. The partial holes 1006 and 1008 in the top portion of the barrel 202 also for example have corresponding semi-conical shapes, such that conical holes or voids are defined. This for example aids the operation of filling the voids with the conductive material to form the conductive plugs 1010, 1012. Furthermore, the semi-conical shape of the partial holes 1003, 1004 will encourage the plugs 1010 and 1012 to remain with the diffuser 204 in case of detachment of the diffuser 204 from the barrel 202.

FIG. 11A is a plan view of a housing 1100 for a light source according to a further example embodiment. The barrel 202 comprises a recessed surface 1102 running around its upper portion which is recessed with respect to the top surface 203 of the barrel. This recessed surface 1102 provides a mounting for the diffuser 204. Furthermore, the top surfaces of the conducting columns 212, 213 are for example substantially flush with this recessed surface 1102, and conducting tracks formed on the surface 1102 partially connect the conducting columns 212, 213. For example, a conducting track 1104 extends around the surface 1102 on one side of the barrel and connects the conducting columns 212, 213 except for a gap 1106. Similarly, a conducting track 1108 extends around the surface 1102 on the opposite side of the barrel and connects the conducting columns 212, 213 except for a gap 1110. The gaps 1106 and 1110 are for example filled by a conductive material attached to the diffuser 204, which for example has a footprint indicated by the dashed circles 1112 and 1114 in FIG. 11A.

Figure 11B:
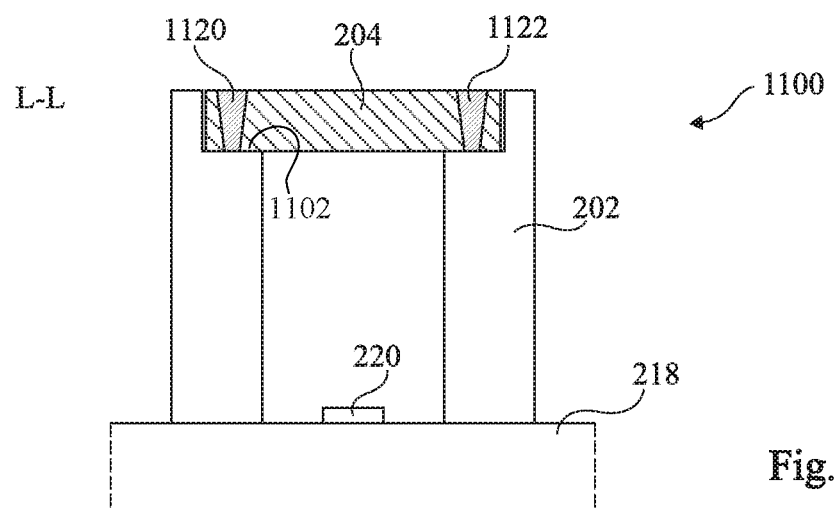
FIG. 11B is a cross-section view of the housing of FIG. 11A according to an example embodiment.

FIG. 11B is a cross-section view of the housing 1100 taken along a line L-L shown in FIG. 11A traversing the barrel 202 through the gaps 1106, 1110 in the tracks 1104, 1108. As illustrated, the conductive material bridging the gaps is for example in the form of conductive plugs 1120, 1122, which are for example conical in shape, as represented in FIG. 11B. These plugs are for example formed by filling conical through-holes drilled in the diffuser 204.

A method of fabricating the housing 1100 of FIGS. 11A and 11B for example involves forming the barrel 202 having the conducting tracks 1104 and 1108, and forming the diffuser 204 having conical through-holes. The diffuser 204 is then mounted in the barrel 202, and is for example fixed with glue. A conductive material is then for example deposited to fill the conical through-holes in the diffuser 204 and thereby bridge the gaps 1106, 1110 and create the electrical connections between the conducting columns 212, 213. For example, the conductive material is a conductive glue.

An advantage of the embodiments of FIGS. 10 and 11 is that the use of conductive plugs to bridge gaps in conducting tracks provides a simple and effective technique for fixing the diffuser to the barrel at the same time as creating an electrical connection that will be lost if the diffuser becomes detached from the barrel. Examples of a circuit for detecting an open circuit between the conducting columns 212, 213, and for controlling the light source 220 in response, will now be described with reference to FIGS. 12A, 12B and 12C. These circuits can for example be implemented with any of the housings of FIGS. 2 to 11 described above.

Figures 12A, 12B, 12C:
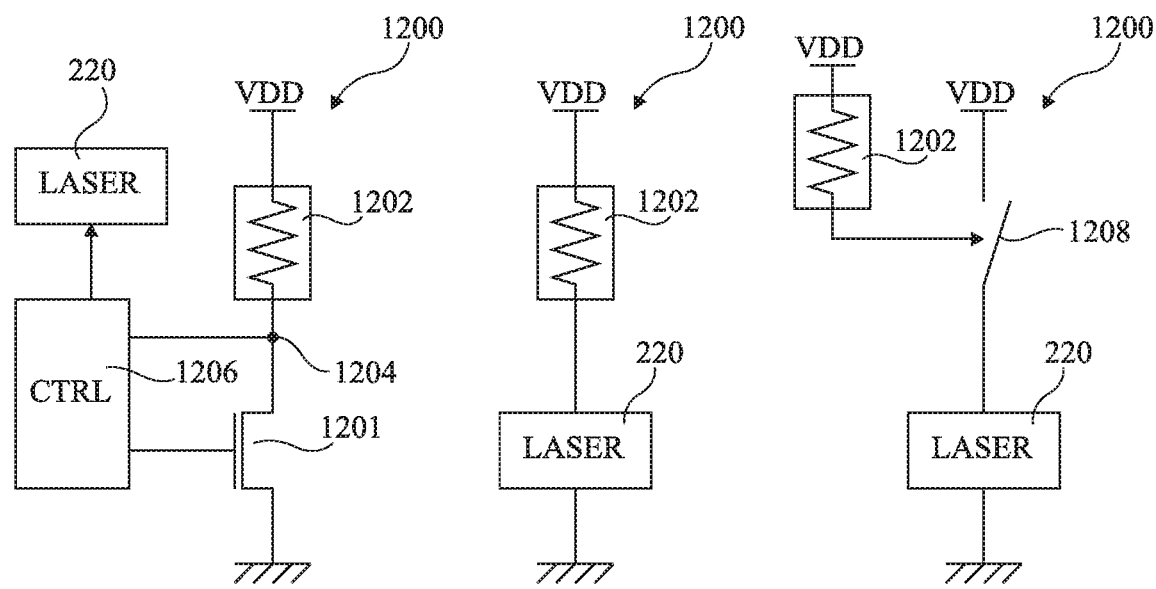
FIG. 12A schematically illustrates a detection circuit for detecting an open circuit according to an embodiment of the present disclosure.
FIG. 12B schematically illustrates a detection circuit for detecting an open circuit according to a further embodiment of the present disclosure.
FIG. 12C schematically illustrates a detection circuit for detecting an open circuit according to yet a further embodiment of the present disclosure.

FIGS. 12A, 12B and 12C schematically illustrate different embodiments of a circuit 1200 implemented in and/or on the substrate 218 and configured to detect a detachment of the diffuser 204 from the barrel 202.

In the example of FIG. 12A, the circuit 1200 comprises a transistor 1201, for example an NMOS transistor, coupled in series with a conductive loop 1202 between the supply voltage rail VDD and the ground rail. The conductive loop 1202 corresponds to the loop formed by the conducting columns 212, 213 and the conductive wires or tracks formed on or fixed to the diffuser 204. An intermediate node 1204 between the conductive loop 1202 and the transistor 1201 is coupled to a control circuit (CTRL) 1206, which also controls the gate of the transistor 1201 and the light source 220.

In operation, the control circuit 1206 for example periodically activates the transistor 1201, causing a current to flow through the conductive loop 1202 if it is not in open circuit. The voltage at the node 1204 will thus rise towards the supply voltage VDD and settle at a level based on the relative resistance values of the conductive loop 1202 and the ON resistance of the transistor 1201. The control circuit 1206 is for example configured to compare the voltage at the node 1204 with a threshold level, and if this threshold is exceeded, to activate the light source 220, or maintain the activation of the light source 220 if it is already on. If, however, the control circuit 1206 detects that the voltage at the node 1204 falls or remains low when the transistor 1220 is activated, this indicates an open circuit in the conductive loop 1202, and the control circuit 1206 is configured to deactivate the light source 220 in response.

In the example of FIG. 12B, the circuit 1200 simply couples the light source 220 to a supply voltage rail VDD via the conductive loop 1202. The resistance of this conductive loop 1202 when the diffuser 204 is correctly in place is for example configured to be of 6 ohms or less, and in some embodiments of 3 ohms or less. If the diffuser 204 becomes detached causing an open circuit in the conductive loop 1202, the light source 220 will be disconnected from the supply voltage.

In the example of FIG. 12C, the circuit 1200 comprises a switch 1208 controlled by an activation signal received via the conductive loop 1202. For example, the activation signal corresponds to the supply voltage VDD. The switch 1208 couples the light source 220 to the supply voltage rail VDD. Under normal conditions, the conductive loop 1202 supplies the voltage VDD to the switch 1208, which is thus conducting and causes the light source 220 to be activated. If, however, the diffuser 204 becomes detached causing an open circuit in the conductive loop 1202, the switch 1208 will be rendered non-conducting, thereby deactivating the light source 220.

An advantage of the embodiment of FIG. 12C with respect to the embodiment of FIG. 12B is that the current flowing through the conductive loop 1202 is relatively low, leading to low power consumption.

Figure 13:
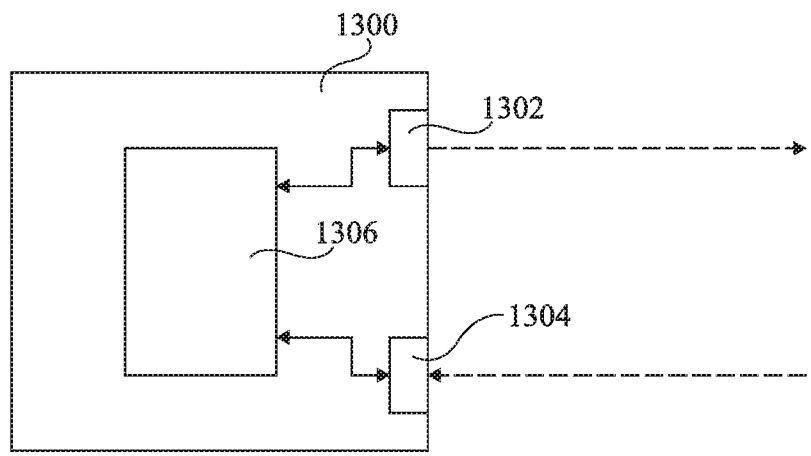
FIG. 13 schematically illustrates an electronic device comprising a light source according to an example embodiment of the present disclosure.

FIG. 13 schematically illustrates an electronic device 1300 comprising a light source module 1302 comprising a light source mounted on a substrate and housed in a housing as described herein above. The device 1300 is for example a ranging device or imaging device capable of capturing one or more ranges and/or a depth map of the image scene. The device 1300 for example comprises an image sensor 1304 formed of an array of SPADs (Single Photon Avalanche Diodes) or of other types of depth sensing elements. The image sensor 1304 is for example configured to receive the light generated by the light source module 1302 after reflection by one or more objects in the image scene. The light source module 1302 and image sensor 1304 are for example coupled to a processing device 1306 configured to control the laser beam emitted into the image scene by the module 1302 and to process readings from the image sensor 1304 in order to extract one or more ranges and/or a depth map.

The device 1300 is for example a ranging device, a 3D digital camera, a webcam, a mobile telephone or smart phone, or other device having a ranging capability.

Having thus described at least one illustrative embodiment, various alterations, modifications and improvements will readily occur to those skilled in the art. For example, it will be apparent to those skilled in the art that the number of conducting columns formed in the barrel of the housing and the number of electrical connections between the conducting columns can be selected based on factors such as the desired resistance of the conducting paths and the desired robustness of the design to false detections.

Furthermore, while conducting columns have been described that can be formed by depositing material in through-holes in the barrel 202, other forms of conducting column could be envisaged, such as columns formed by wires, pins, surface coatings, etc.

Furthermore, it will be apparent to those skilled in the art that the various features described in relation with the various embodiments could be combined, in alternative embodiments, in any combination. For example, it would be possible to envisage designs that use a fuse connecting a first pair of conducting columns and a conducting track connecting a second pair of conducting columns in order to provide two independent verification mechanisms.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A housing for a light source mounted on a substrate, the housing comprising:
 a barrel having first and second conducting columns; and
 a diffuser having one or more conductive paths on a side surface of the diffuser, the diffuser mounted to the barrel and arranged to electrically couple the first and second conducting columns together by the one or more conductive paths.

2. The housing of claim 1, wherein the diffuser comprises a transparent element, and wherein the one or more conductive paths extend around a perimeter of the diffuser at the side surfaces of the diffuser.

3. The housing of claim 1, wherein the one or more conductive paths is a coating that extends around an entire perimeter of the diffuser.

4. The housing of claim 1, wherein the barrel includes a recess, wherein the diffuser is positioned in the recess.

5. The housing of claim 1, wherein the one or more conductive paths includes a wire that extends around an entire perimeter of the diffuser and is located between side surfaces of the diffuser and the first and second conducting columns.

6. The housing of claim 1, wherein the first and second conducting columns are arranged in first and second through openings, respectively, of the barrel.

7. The housing of claim 1, further comprising conductive glue electrically coupling the one or more conductive paths to the first and second conducting columns.

8. The housing of claim 1, wherein the barrel comprises, at one end, a first surface configured to be coupled to the substrate, the first and second conducting columns extending between the first surface of the barrel and an opposing second surface.

9. An electronic device comprising:
 a substrate;
 a light source coupled to the substrate; and
 a housing coupled to the substrate, the housing comprising:
  a housing body having a central through opening and first and second through openings, the light source being located in the central through opening;
  first and second conducting columns in the first and second through openings, respectively, of the housing body;
  one or more conductive paths that electrically couple the first and second conductive columns together; and
  a diffuser coupled to the housing body in a mounting position,
 wherein the one or more conductive paths and the diffuser are located in a recess of the housing body.

10. The electronic device of claim 9, wherein the diffuser includes first and second frame portions and a transparent element, wherein the transparent element is held by the first and second frame portions.

11. The electronic device of claim 10, wherein the one or more conductive paths includes a first conductive path and a second conductive path, wherein the first conductive path is on the first frame portion and the second conductive path is on the second frame portion.

12. The electronic device of claim 11, wherein the first and second conducting columns extend along respective sides of the housing body.

13. The electronic device of claim 9, further comprising a circuit configured to supply a supply voltage to the light source by the first and second conducting columns.

14. The electronic device of claim 9, further comprising a circuit configured to supply a supply voltage to the light source by a switch controlled by an activation signal provided by the first and second conducting columns.

15. The electronic device of claim 9, further comprising a circuit configured to detect a detachment of the diffuser from the housing body based on a voltage drop across the first and second conducting columns and to deactivate the light source wherein the diffuser disengages from the mounting position.

16. An electronic device comprising:
 a substrate;
 a light source coupled to the substrate; and
 a housing coupled to the substrate, the housing comprising:
  a housing body having a through opening, the light source being located in the through opening;
  first and second conducting columns coupled to the housing body;
  a diffuser coupled to the housing body in a mounting position, the diffuser having side surfaces and a conductive material on the side surfaces; and
  one or more conductive paths between conductive material on the side surfaces of the diffuser and the first and second conductive columns.

17. The electronic device of claim 16, wherein the conductive material on the side surfaces of the diffuser is a wire that extends around a perimeter of the diffuser.

18. The electronic device of claim 16, wherein the conductive material on the side surfaces of the diffuser is a coating that coats the entire perimeter of the side surfaces of the diffuser.

19. The electronic device of claim 18, wherein the coating is between first and second sides of the side surfaces of the diffuser and the first and second conductive columns, respectively.

* * * * *